United States Patent
Lokken et al.

(10) Patent No.: US 9,182,245 B2
(45) Date of Patent: Nov. 10, 2015

(54) CALIBRATION AND COMPENSATION METHOD AND APPARATUS FOR RESISTIVE SENSOR MEASUREMENT BRIDGE

(75) Inventors: Ivar Lokken, Tiller (NO); Christian Hergot, Tiller (NO)

(73) Assignee: HITTITE MICROWAVE CORPORATION, Chelmsford, MA (US)

( * ) Notice: Subject to any disclaimer, the term of this patent is extended or adjusted under 35 U.S.C. 154(b) by 769 days.

(21) Appl. No.: 13/522,220

(22) PCT Filed: Nov. 5, 2010

(86) PCT No.: PCT/IB2010/003014
§ 371 (c)(1),
(2), (4) Date: Nov. 26, 2012

(87) PCT Pub. No.: WO2011/086409
PCT Pub. Date: Jul. 21, 2011

(65) Prior Publication Data
US 2013/0060498 A1 Mar. 7, 2013

Related U.S. Application Data

(60) Provisional application No. 61/295,357, filed on Jan. 15, 2010.

(51) Int. Cl.
*G06F 11/00* (2006.01)
*G01D 3/028* (2006.01)
*G01D 18/00* (2006.01)

(52) U.S. Cl.
CPC ............. *G01D 3/028* (2013.01); *G01D 18/008* (2013.01); *H01L 2924/0002* (2013.01)

(58) Field of Classification Search
CPC ................ H01L 2924/0002; H01L 2924/00; H01L 27/14643; H04N 5/378
USPC ............................ 702/86, 117, 118, 182–185
See application file for complete search history.

(56) References Cited

U.S. PATENT DOCUMENTS

| | | | |
|---|---|---|---|
| 5,986,839 A | 11/1999 | Klaassen et al. | |
| 6,121,823 A | 9/2000 | Summerfield | |
| 7,751,139 B1 | 7/2010 | Voo | |
| 7,800,854 B1* | 9/2010 | Tan et al. | 360/66 |
| 2007/0242384 A1 | 10/2007 | Contreras et al. | |
| 2010/0145651 A1* | 6/2010 | Han et al. | 702/107 |

OTHER PUBLICATIONS

International Search Report for PCT/IB2010/003014, dated Nov. 21, 2011.

* cited by examiner

*Primary Examiner* — Edward Raymond
(74) *Attorney, Agent, or Firm* — Knobbe Martens Olson & Bear LLP

(57) ABSTRACT

A resistive sensor read-out apparatus is disclosed. In one embodiment, the resistive sensor read-out apparatus comprises an active sensor, a reference element, a bias circuit, a current-to-voltage converter, an analog-to-digital converter and a calibration processor. The bias circuit is coupled to the active sensor and the reference element and configured to calibrate one or more mismatches between the active sensor and the reference element. The current-to-voltage converter is coupled to an output of the bias circuit. The analog-to-digital converter is coupled to an output of the current-to-voltage converter. The calibration processor is coupled to an output of the analog-to-digital converter and configured to estimate an error caused by limited resolution mismatch calibration. The calibration processor is also configured to at least partially control calibration performed at the bias circuit based on the error.

20 Claims, 4 Drawing Sheets

CALIBRATION AND COMPENSATION METHOD AND APPARATUS FOR RESISTIVE SENSOR MEASUREMENT BRIDGE

This application claims priority to U.S. Provisional Application Ser. No. 61/295,357 filed on Jan. 15, 2010.

FIELD OF THE DISCLOSURE

The present disclosure generally relates to resistive sensor applications, and more particularly, to a calibration and compensation scheme for resistive sensor bridges associated with thermal detection and thermal imaging systems.

BACKGROUND OF THE DISCLOSURE

Resistive sensors are used in many applications, such as thermal detection and thermal imaging systems. A thermal imaging system or camera uses a large array of sensors to construct an image, wherein the new images are generated at short intervals to create a moving picture. Due to physical variations between the sensors, each pixel must be calibrated individually before the pixel outputs are combined into a picture. In other thermal sensor systems calibration may also be necessary to avoid saturating the read-out electronics. Thermal sensors are well known to have high temperature sensitivity, and thus, are significantly affected by changes in ambient temperature as well as changes in the incident thermal radiation that is to be measured. Accordingly, a shielded or thermally shorted reference sensor may be used to mitigate the sensitivity to operating conditions by skimming off such variations caused by environmental changes.

FIG. 1 shows the prior art technique of having a current skimming sensor bridge with digital calibration electronics. The active sensor $R_{act}$ 101 is subjected to incident thermal radiation which affects and alters its resistance. To reduce the sensitivity to operating conditions, the current is skimmed off through a reference resistor or sensor element $R_{ref}$ 102, with the same nominal resistance and similar thermal properties to $R_{act}$ 101. In a thermal imaging array, $R_{ref}$ 102 can be shielded or thermally shorted. The output current is given by:

$$I_{out} = \frac{V_{bias1}}{R_{act}} - \frac{V_{bias2}}{R_{ref}} \quad (1)$$
$$= I_{act} - I_{ref}.$$

The output current is converted to a voltage by a current-to-voltage (IV) amplifier 105 and converted to digital data with an analog-to-digital converter (ADC) 106 before being fed to the digital output 107.

Since $V_{bias1}$ and $V_{bias2}$ are controlled by $V_{b1}$ and $V_{b2}$ through the bias transistors $M_1$ 103 and $M_2$ 104, the calibration processor 109 can calibrate for mismatches between the active sensor and the reference element by adjusting $V_{b1}$ and $V_{b2}$ individually, using digital algorithms based on an analysis of the ADC output. However, the calibration processor is a digital signal processor (DSP) that produces digital data. The data must be converted to voltages $V_{b1}$ and $V_{b2}$ by means of digital-to-analog converters (DACs) 108a and 108b. Therefore, the resolution of the mismatch calibration is limited by the resolution of the DACs used to control the biasing, and consequently, the required resolution of the mismatch calibration must be at least as high as that of the signal chain and ADC. In applications involving large sensor arrays, such as thermal imaging systems, the implementation is substantially complex because the typical sensors are simultaneously biased and a large number of high resolution DACs will use a lot of power and chip area.

Based on the foregoing, there is a need for resistive sensor bridges which may be used with thermal detection and thermal imaging systems and overcomes deficiencies of the prior art. More specifically, there is a need for a resistive sensor bridge with calibration and compensation schemes which are less complex and provide better resolution.

SUMMARY OF THE DISCLOSURE

In satisfaction of the aforenoted needs, a resistive sensor read-out apparatus is disclosed. In one embodiment, the resistive sensor read-out apparatus comprises an active sensor, a reference element, a bias circuit, a current-to-voltage converter, an analog-to-digital converter and a calibration processor. The bias circuit is coupled to the active sensor and the reference element and configured to calibrate one or more mismatches between the active sensor and the reference element. The current-to-voltage converter is coupled to an output of the bias circuit. The analog-to-digital converter is coupled to an output of the current-to-voltage converter. The calibration processor is coupled to an output of the analog-to-digital converter and configured to estimate an error caused by limited resolution mismatch calibration. The calibration processor is also configured to at least partially control calibration performed at the bias circuit based on the error.

In a refinement, the bias circuit is an adjustable current mirror that is configured to calibrate mismatches between the active sensor and the reference element based on digital control thereof.

In another refinement, the calibration processor is configured to identify effects of quantization errors in the bias circuit.

In another refinement, the calibration processor is configured to cancel effects of quantization errors in the bias circuit.

In another refinement, the calibration processor is configured to identify effects of non-linearities in the bias circuit.

In another refinement, the calibration processor is configured to cancel effects of non-linearities in the bias circuit.

In yet another refinement, the calibration processor is configured to characterize and store non-linearities of the bias circuit in a look-up table.

Another resistive sensor read-out apparatus is disclosed. The resistive sensor read-out apparatus comprises an active sensor, a reference element, an adjustable current mirror, a current-to-voltage converter, an analog-to-digital converter and a digital signal processor. The adjustable current mirror is coupled to the active sensor and the reference element, and further, configured to calibrate mismatches between the active sensor and the reference element. The current-to-voltage converter is coupled to an output of the adjustable current mirror. The analog-to-digital converter is coupled to an output of the current-to-voltage converter. The digital signal processor is coupled to an output of the analog-to-digital converter. Furthermore, the digital signal processor includes at least one look-up table, a calibration processor, at least one arithmetic block and a quantizer. The digital signal processor is also configured to at least partially control calibration performed at the adjustable current mirror.

In a refinement, the look-up table is used to store current estimate coefficients of the reference element.

In another refinement, the calibration processor is configured to identify quantization errors caused by limited resolution mismatch calibration.

In another refinement, the at least one arithmetic block is configured to cancel quantization errors caused by limited resolution mismatch calibration.

In another refinement, the quantizer is configured to convert high-to-low resolution coefficients.

In satisfaction of the aforenoted needs, a method for calibrating and compensating a resistive sensor read-out is also disclosed. The method includes the steps of providing an active sensor; providing a reference element; providing a bias circuit for biasing the active sensor and the reference element; determining a mismatch between the active sensor and the reference element; identifying effects of limited resolution in the bias circuit based on the mismatch between the active sensor and the reference element; and correcting the effects of limited resolution in the bias circuit.

In a refinement, the method also includes a step of converting the mismatch between the active sensor and the reference element into digital form.

In another refinement, the bias circuit is adjustably configured to bias the active sensor and the reference element at least partially based on the effects of limited resolution in the bias circuit.

In another refinement, the bias circuit is an adjustable current mirror.

Other advantages and features will be apparent from the following detailed description when read in conjunction with the attached drawings.

BRIEF DESCRIPTION OF THE DRAWINGS

Features and advantages of the disclosure will be apparent to those of ordinary skill in the art in view of the detailed description of exemplary embodiments which is made with reference to the drawings.

It should be understood that the drawings are not necessarily to scale and that the disclosed embodiments are sometimes illustrated diagrammatically and in partial views. In certain instances, details which are not necessary for an understanding of the disclosed methods and apparatuses or which render other details difficult to perceive may have been omitted. It should be understood, of course, that this disclosure is not limited to the particular embodiments illustrated herein.

DETAILED DESCRIPTION OF THE DISCLOSURE

The present disclosure may be based on the replacement of biasing digital-to-analog converters (DACs) for mismatch calibration, with an adjustable or programmable current mirror being controlled by a digital calibration processor. Furthermore, the disclosure may be based on the measurement and storage of $I_{ref}$ and INL estimates, and the use of these estimates for compensation of quantization errors and non-linearity errors during operation.

Figure 1:
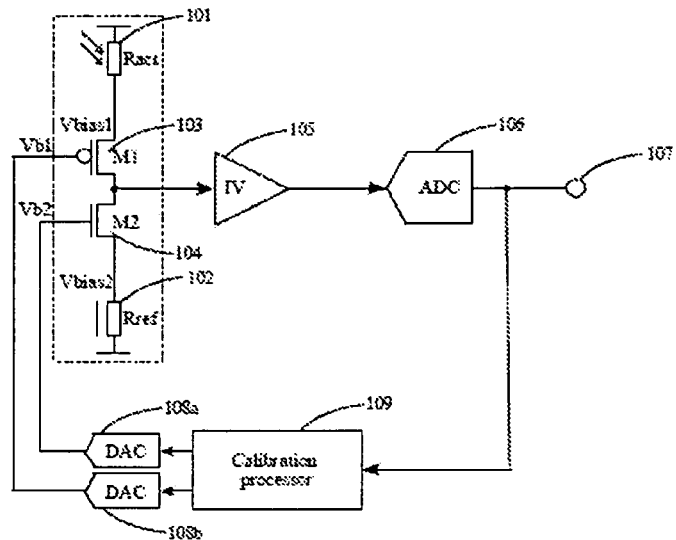
FIG. 1 is a schematic of a prior art solution of employing a current skimming bridge and mismatch calibration by digital control of the bias voltages using digital-to-analog converters (DACs)

Referring now to the drawings, FIG. 1 illustrates an embodiment of the prior art solution, where a digital calibration processor is used to calibrate for mismatches between the active sensor and the reference element through control of individual bias voltages using control DACs.

Figure 2:
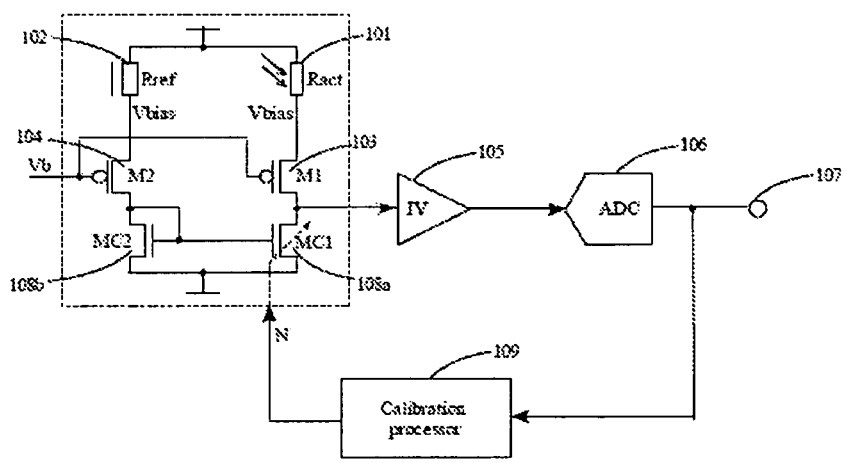
FIG. 2 is a schematic of an exemplary mismatch calibration apparatus constructed in accordance with the teachings of the present disclosure.

In contrast, FIG. 2 illustrates an embodiment constructed in accordance with the teachings of the disclosure wherein the calibration DACs may be replaced with an adjustable or programmable current mirror bias circuit. The active sensor $R_{act}$ 101 and reference element $R_{ref}$ 102 may be biased with a current mirror comprising of transistors $M_{C1}$ 108a and $M_{C2}$ 108b. The output current may be provided by:

$$I_{out} = \frac{V_{bias}}{R_{act}} - \frac{N}{M} \cdot \frac{V_{bias}}{R_{ref}} \qquad (2)$$
$$= I_{act} - \frac{N}{M} \cdot I_{ref},$$

where N and M may be the widths of $M_{C1}$ and $M_{C2}$, respectively. Transistors $M_1$ 103 and $M_2$ 104 may serve to hold the bias voltage $V_{bias}$ constant. The output current may be converted to a voltage by an IV amplifier 105 and converted to digital data with an analog-to-digital converter (ADC) 106 before being fed to the digital output 107. Furthermore, the calibration processor 109 may calibrate for mismatches by adjusting the width N of $M_{C1}$ 108a, which may be assumed to be adjustable or programmable while the width M of $M_{C2}$ 108b may be fixed. Accordingly, the current mirror may serve as a current-mode DAC. In alternative embodiments, the width M of $M_{C2}$ 108b may be adjustable while the width N of $M_{C1}$ 108a may be fixed, or both widths M and N of $M_{C1}$ 108a and $M_{C2}$ 108b, respectively, may be adjustable.

The calibration processor 109 may be a fully digital circuit capable of operating at very high resolution with relatively little cost in terms of power and chip area. Upon determination of an ideal mismatch calibration coefficient C with very high resolution, and presuming the programmable current mirror has equally high resolution, the ideal output current from the current skimming bridge may be determined to be:

$$I_{out,ideal} = I_{act} - C \cdot I_{ref} \qquad (3)$$

If the programmable current mirror has limited resolution, the ideal coefficient C may be quantized to a lower resolution representation Q(C), which further, may be applied to the current mirror with programmable N. The output current, having results the same as equation (2), may then be determined by:

$$I_{out,real} = I_{act} - Q(C) \cdot I_{ref}, \; Q(C) = \frac{N}{M}. \qquad (4)$$

Figure 3:
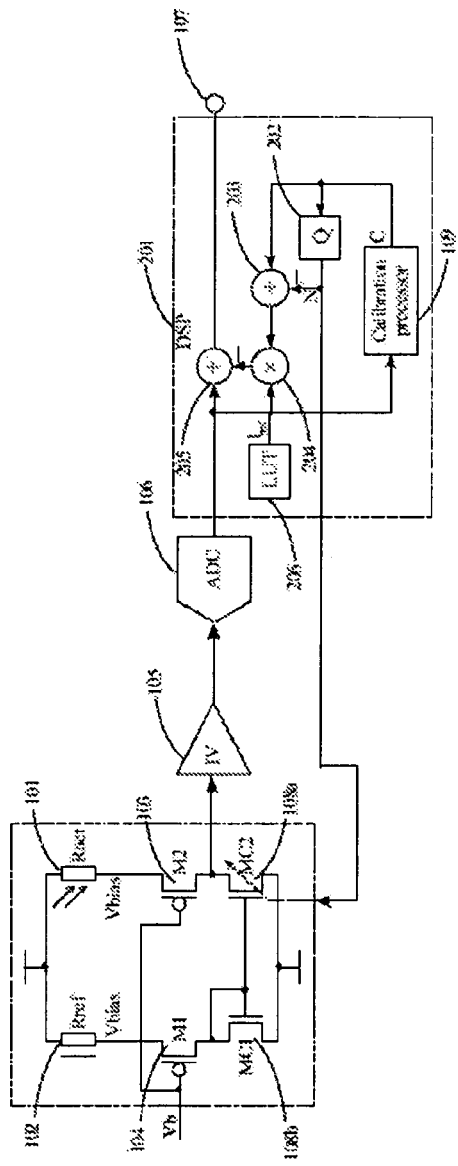
FIG. 3 is a schematic of a compensation apparatus for correcting limited resolution mismatch calibration quantization errors.

Turning now to FIG. 3, another compensation device is disclosed wherein $I_{ref}$ estimates may be stored in a look-up table (LUT) and used to compensate for the quantization errors of a low resolution current mirror. The error caused by low resolution programmable current mirror quantization can be calculated by subtracting equation (4) from equation (3), for example:

$$\varepsilon_{I_{out}} = I_{out,ideal} - I_{out,ideal} \quad (5)$$
$$= I_{act} - C \cdot I_{ref} - (I_{act} - Q(C) \cdot I_{ref})$$
$$= I_{ref} \cdot (Q(C) - C)$$

The digital signal processor (DSP) 201 may be expanded to include arithmetic blocks for calculating and subtracting the error on-line during operation. The calibration processor 109 may be configured to calculate high resolution calibration coefficients. The quantizer 202 may convert the high resolution calibration coefficients to a lower resolution, or the like, and transmit the coefficients to the programmable current mirror 108a. Additionally, the error calculation of equation (5) may be realized using a subtractor 203, a multiplier 204, and the like. The output may also be compensated by another subtractor 205.

The $I_{red}$ value may be estimated by incrementing the programmable current mirror since for value N the output may be:

$$I_{out,1} = I_{act} - \frac{N}{M} \cdot I_{ref}, \quad (6)$$

and for N+1 the output may be:

$$I_{out,2} = I_{act} - \frac{N+1}{M} \cdot I_{ref}. \quad (7)$$

Subtracting equation (6) from (7) and multiplying by M may provide the estimate of $I_{ref}$ used to find the quantization error effect of equation (5):

$$I_{ref} = (I_{out,2} - I_{out,1}) \cdot M \quad (8)$$

Additionally, to quantize errors, the low resolution DAC or programmable current mirror may have non-linearities. The integral non-linearity for code N may be denoted INL(N). When including non-linearity, equation (4) may be modified to:

$$I_{out,real} = I_{act} - (Q(C) + INL(Q(C))) \cdot I_{ref}, \quad Q(C) = \frac{N}{M}. \quad (8)$$

The integral non-linearity for code N, INL(N), may be defined as:

$$INL(N) = I_{out}(N) - N \cdot \overline{\Delta}, \quad \overline{\Delta} = \frac{I_{out}(N_{max}) - I_{out}(N_{min})}{N_{max} - N_{min}}, \quad (9)$$

wherein INL(N) may be the deviation for code N from a perfectly linear transfer function drawn between the minimum and maximum values.

Figure 4:
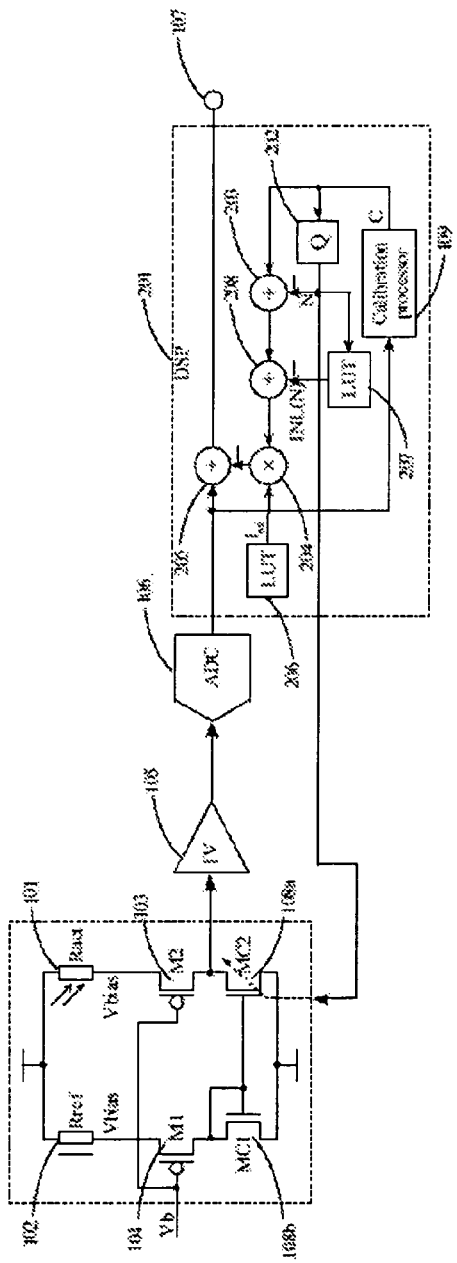
FIG. 4 is a schematic of a compensation apparatus for correcting limited resolution mismatch calibration quantization errors and non-linearities.

FIG. 4 shows an embodiment of the disclosure where $I_{ref}$ and INL estimates may be stored in LUTs and used to compensate for the quantization errors and the non-linearity of a low resolution current mirror. The digital signal processor 201 may be expanded to include arithmetic blocks for calculating and subtracting the quantization and non-linearity errors on-line during operation. The calibration processor 109 may calculate high resolution calibration coefficients. The quantizer 202 may convert the high resolution calibration coefficients to lower resolutions and transmit the coefficients to the programmable current mirror 108a. Additionally, the error calculation in equation (5) may be realized with a subtracter 203, a multiplier 204, and the like. Further subtractions may also be provided by another subtracter 205. The $I_{ref}$ estimate may be taken from a LUT 206. For each N the corresponding INL(N) may be taken from another LUT 207 and subtracted with another subtracter 208. When non-linearity is included, the estimate for $I_{ref}$ in equation (8) may be modified to:

$$I_{ref} = \frac{(I_{out,2} - I_{out,1}) \cdot M}{1 + INL(N+1) - INL(N)}. \quad (10)$$

Figure 5:
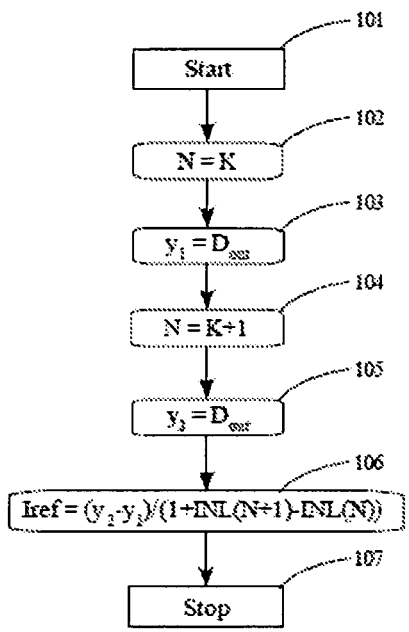
FIG. 5 is a flow chart of an algorithm for estimating and storing $I_{ref}$ coefficients.

FIG. 5 illustrates an exemplary flow chart for the algorithm to find and store $I_{ref}$ estimate coefficients. The algorithm may be executed off-line or during production, and coefficients may be stored in a LUT. Value $D_{out}$ may refer to the ADC data output. Once execution of the algorithm begins 101, the current mirror programmable branch N may be set to a given value K 102, the output may be temporarily stored 103, the current mirror programmable branch may be incremented one step 104, the output may be temporarily stored again 105, the $I_{ref}$ estimate coefficient may be calculated according to equation (11) 106 and the test sequence may end 107.

Several $I_{ref}$ coefficients for different temperatures or environment variations may be calculated and stored, while the $I_{ref}$ estimate used during operation may be interpolated from these coefficients. The $I_{ref}$ coefficients may be stored in a LUT according to FIG. 3, for example. The current mirror non-linearity may be characterized before the $I_{ref}$ estimation algorithm is executed. To characterize the non-linearity, a constant test current may be applied and the programmable current mirror coefficient N may be ramped through all codes from $N_{min}$ to $N_{max}$. Current mirror characterization may be executed off-line or during production. For each code the ADC output value may be recorded and the deviation from a linear transfer function may be calculated.

Figure 6:
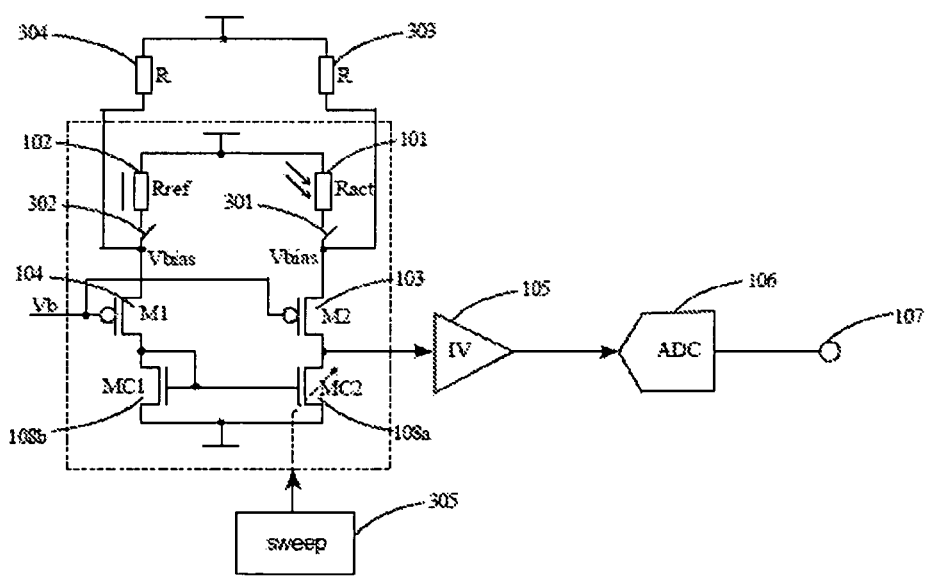
FIG. 6 is a schematic of a compensation apparatus for characterizing static non-linearity of a programmable current mirror and storing integral non-linearity (INL) coefficients.

FIG. 6 shows an embodiment of the disclosure where the current mirror non-linearity may be characterized using a small amount of extraneous circuitry. The switches 301 and 302 may decouple or disable the active sensor 101 and the reference element 102 and replace them with, for example, temperature stable resistors 303 and 304. This may mitigate bias heating that may corrupt the characterization. The digital processor 305 may sweep the programmable current mirror from $N_{min}$ to $N_{max}$, and for each code the non-linearity INL(N) may be calculated from the digital output 107.

Figure 7:
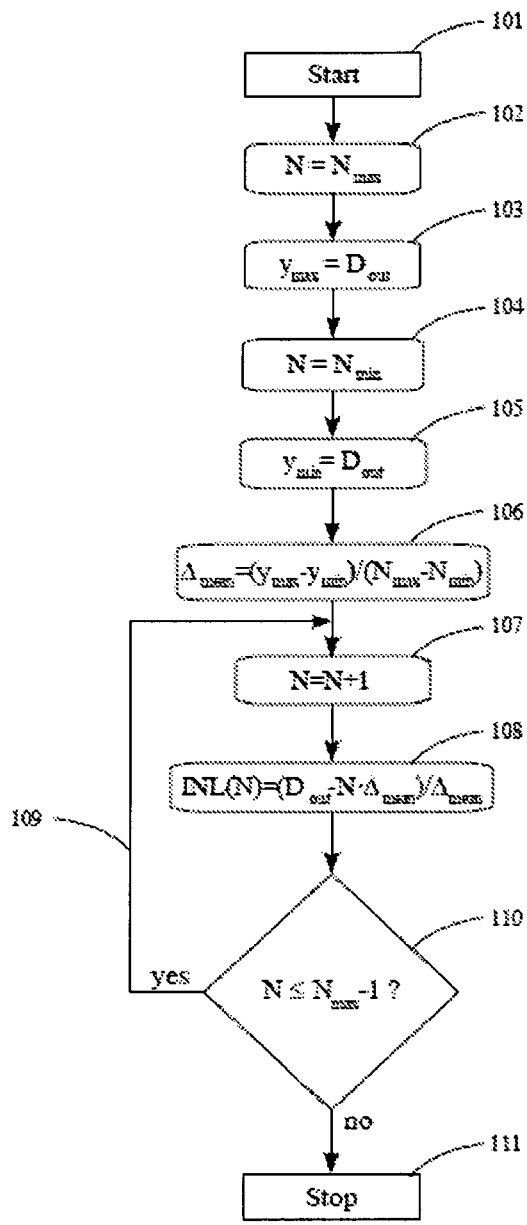
FIG. 7 is a flow chart of an algorithm for estimating and storing INL coefficients.

FIG. 7 shows a flowchart for the algorithm to find and store INL estimate coefficients. The algorithm may be executed off-line or during production, and the recorded INL coefficients may be stored in a LUT. Value $D_{out}$ may refer to the ADC data output. When execution of the algorithm begins 101, the current mirror programmable branch may be set to the maximum value 102, the output may be temporarily stored 103, the current mirror programmable branch may be set to the minimum value 104, the output may be temporarily stored 105, the mean quantization step may be calculated in order to define the linear transfer function between the minimum and maximum values 106, the current mirror programmable branch may be incremented 107, the INL for code N may be calculated in accordance with equation (10) 108, and the process may be repeated for all non-linear codes 109. When the current mirror has been characterized for all of the codes 110 the characterization sequence may end or stop 111. The INL for every code may be stored in a LUT as shown in FIG. 4, for example.

While only certain embodiments have been set forth, alternatives and modifications will be apparent from the above description to those skilled in the art. These and other alternatives are considered equivalents and within the spirit and scope of this disclosure and the appended claims.

What is claimed:

1. A resistive sensor read-out apparatus, comprising:
   an active sensor;
   a reference element;
   a bias circuit coupled to the active sensor and the reference element, the bias circuit configured to calibrate one or more mismatches between the active sensor and the reference element;
   a current-to-voltage converter coupled to an output of the bias circuit;
   an analog-to-digital converter coupled to an output of the current-to-voltage converter; and
   a calibration processor coupled to an output of the analog-to-digital converter and configured to estimate an error caused by limited resolution mismatch calibration, the calibration processor configured to at least partially control calibration performed at the bias circuit based on the error.

2. The apparatus of claim 1, wherein the bias circuit is an adjustable current mirror configured to calibrate mismatches between the active sensor and the reference element based on digital control thereof.

3. The apparatus of claim 1, wherein the calibration processor is configured to identify effects of quantization errors in the bias circuit.

4. The apparatus of claim 1, wherein the calibration processor is configured to identify effects of quantization errors in the bias circuit based on the output of the analog-to-digital converter.

5. The apparatus of claim 1, wherein the calibration processor is configured to cancel effects of quantization errors in the bias circuit.

6. The apparatus of claim 1, wherein the calibration processor is configured to cancel effects of quantization errors in the bias circuit based on the output of the analog-to-digital converter.

7. The apparatus of claim 1, wherein the calibration processor is configured to identify effects of non-linearities in the bias circuit.

8. The apparatus of claim 1, wherein the calibration processor is configured to identify effects of non-linearities in the bias circuit based on the output of the analog-to-digital converter.

9. The apparatus of claim 1, wherein the calibration processor is configured to cancel effects of non-linearities in the bias circuit.

10. The apparatus of claim 1, wherein the calibration processor is configured to cancel effects of non-linearities in the bias circuit based on the output of the analog-to-digital converter.

11. The apparatus of claim 1, wherein the calibration processor is configured to characterize and store non-linearities of the bias circuit in a look-up table.

12. A resistive sensor read-out apparatus, comprising:
    an active sensor;
    a reference element;
    an adjustable current mirror coupled to the active sensor and the reference element, the adjustable current mirror configured to calibrate mismatches between the active sensor and the reference element;
    a current-to-voltage converter coupled to an output of the adjustable current mirror;
    an analog-to-digital converter coupled to an output of the current-to-voltage converter; and
    a digital signal processor coupled to an output of the analog-to-digital converter, the digital signal processor having at least one look-up table, a calibration processor, at least one arithmetic block, and a quantizer, the digital signal processor configured to at least partially control calibration performed at the adjustable current mirror.

13. The apparatus of claim 12, wherein the look-up table is used to store current estimate coefficients of the reference element.

14. The apparatus of claim 12, wherein the calibration processor is configured to identify quantization errors caused by limited resolution mismatch calibration.

15. The apparatus of claim 12, wherein the at least one arithmetic block is configured to cancel quantization errors caused by limited resolution mismatch calibration.

16. The apparatus of claim 12, wherein the quantizer is configured to convert high-to-low resolution coefficients.

17. A method for calibrating and compensating a resistive sensor read-out, comprising the steps of:
    providing an active sensor;
    providing a reference element;
    providing a bias circuit for biasing the active sensor and the reference element;
    determining a mismatch between the active sensor and the reference element;
    identifying effects of limited resolution in the bias circuit based on the mismatch between the active sensor and the reference element; and
    correcting the effects of limited resolution in the bias circuit.

18. The method of claim 17 further comprising a step of converting the mismatch between the active sensor and the reference element into digital form.

19. The method of claim 17, wherein the bias circuit is adjustably configured to bias the active sensor and the reference element at least partially based on the effects of limited resolution in the bias circuit.

20. The method of claim 17, wherein the bias circuit is an adjustable current mirror.

* * * * *